(12) United States Patent
Hsieh

(10) Patent No.: US 8,476,944 B2
(45) Date of Patent: Jul. 2, 2013

(54) RESET CIRCUIT

(75) Inventor: Ming-Chih Hsieh, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 446 days.

(21) Appl. No.: 12/954,666

(22) Filed: Nov. 25, 2010

(65) Prior Publication Data
US 2012/0043998 A1    Feb. 23, 2012

(30) Foreign Application Priority Data

Aug. 19, 2010  (TW) .................................. 99127669

(51) Int. Cl.
*H03L 7/00*    (2006.01)
(52) U.S. Cl.
USPC ........................................................ 327/142

(58) Field of Classification Search
None
See application file for complete search history.

(56) References Cited

U.S. PATENT DOCUMENTS

2010/0244980 A1*   9/2010   Olson et al. .................. 333/101

\* cited by examiner

*Primary Examiner* — Daniel Rojas
(74) *Attorney, Agent, or Firm* — Altis Law Group, Inc.

(57) ABSTRACT

A reset circuit includes two voltage dividing circuits, a switching circuit, a selection button, two voltage converters, and a processor. The voltage converters convert a first or second power supply for supplying power to the processor. When the first power supply supplies power to the processor the processor operates normally. When the second power supply supplies power to the processor, one of the voltage dividing circuits outputs a signal to the processor to restore an electronic device to factory settings according to the signal.

2 Claims, 2 Drawing Sheets

RESET CIRCUIT

BACKGROUND

1. Technical Field

The present disclosure relates to a reset circuit.

2. Description of Related Art

Electronic devices often have reset buttons for restoring the electronic devices to factory settings. However, it is not uncommon for users to mistakenly or inadvertently activate the reset button, which can result in the loss of personalized settings and data.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
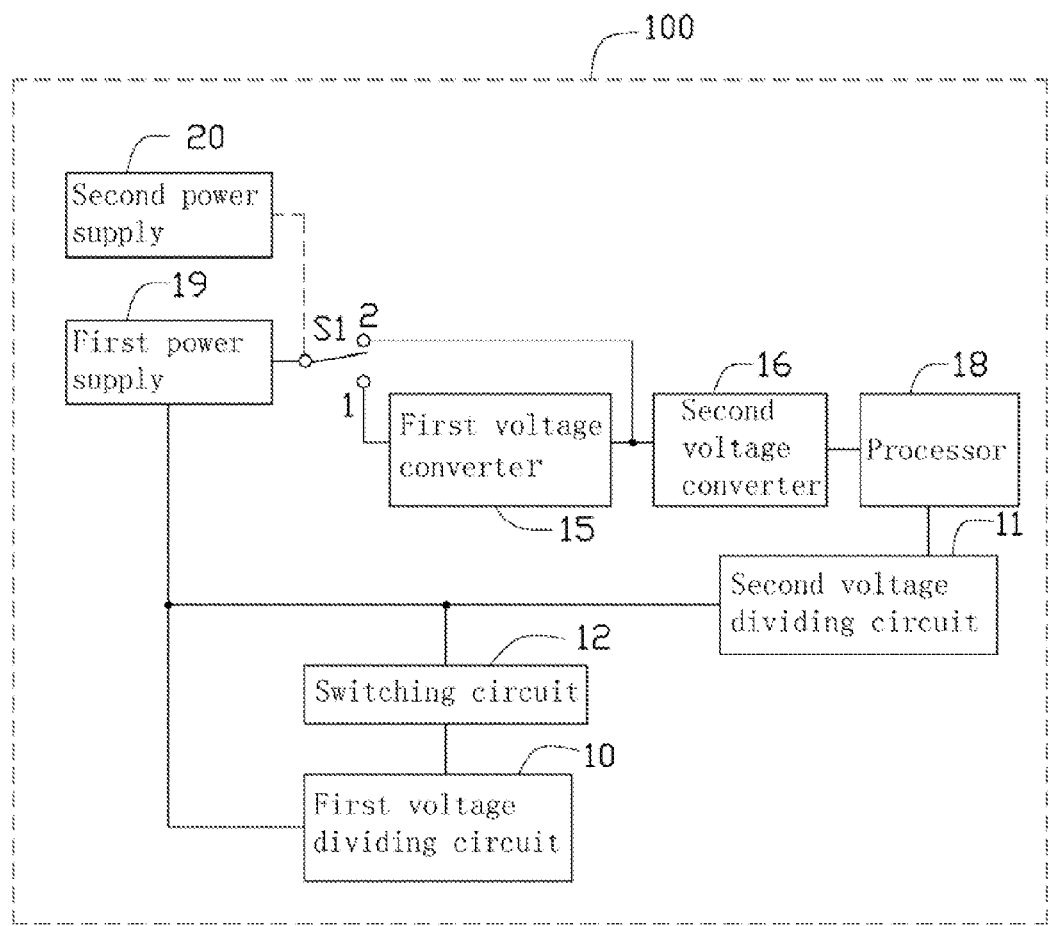
FIG. 1 is a block diagram of an exemplary embodiment of a reset circuit.

Referring to FIG. 1, an exemplary embodiment of a reset circuit is configured to restore an electronic device 100 to factory settings. The reset circuit is set in the electronic device 100, and includes a first voltage dividing circuit 10, a second voltage dividing circuit 11, a switching circuit 12, a selection button S1, a first voltage converter 15, a second voltage converter 16, and a processor 18.

In one embodiment, the selection button S1 is a single pole double throw switch. A first terminal of the pole of the selection button S1 is configured to be connected to a first power supply 19. A first contact 1 of the selection button S1 is connected to an input terminal of the first voltage converter 15. A second contact 2 of the selection button S1 is connected to an input terminal of the second voltage converter 16. A second terminal of the pole of the selection button S1 may selectively contact the first contact 1 or the second contact 2. An output terminal of the first voltage converter 15 is connected to the input terminal of the second voltage converter 16. An output terminal of the second voltage converter 16 is connected to the processor 18. The first voltage converter 15 and the second voltage converter 16 convert the first voltage from the first power supply 19 for supplying power to the processor 18.

The second voltage dividing circuit 11 is configured to be connected to the first power supply 19 and the processor 18. The switching circuit 12 is connected between the first voltage dividing circuit 10 and the second voltage dividing circuit 11, and connected to the first power supply 19. The first voltage dividing circuit 10 is further configured to be connected to the first power supply 19. When the electronic device 100 operates normally, the first terminal of the pole of the selection button S1 is connected to the first power supply 19, and the second end of the pole is connected to the first contact 1 of the selection button S1. At this time, the first voltage converter 15 and the second voltage converter 16 convert the voltage from the first power supply 19 and supply power to the processor 18. The first voltage dividing circuit 10 turns on the switching circuit 12 to make the second voltage dividing circuit 11 output a first signal to the processor 18. Because the processor 18 receives the first signal from the second voltage dividing circuit 11, the processor 18 does not restore the electronic device 100 to factory settings.

When the electronic device 100 needs to be restored, users can replace the first power supply 19 with a second power supply 20, and connect the pole to the second contact 2 of the selection button S1. At this time, the second voltage converter 16 converts the voltage from the second power supply 20 and supplies power to the processor 18. The first voltage dividing circuit 10 turns off the switching circuit 12 to make the second voltage dividing circuit 11 output a second signal to the processor 18. As a result, the processor 18 restores the electronic device 100 to factory settings according to the second signal.

In the embodiment, the first power supply 19 is +12 volts (V), and the second power supply 20 is +5V. The first voltage converter 15 converts the +12V voltage to a +5V voltage. The second voltage converter 16 converts the +5V voltage to a +1.5V voltage. The load voltage of the processor 18 is +1.5V.

Figure 2:
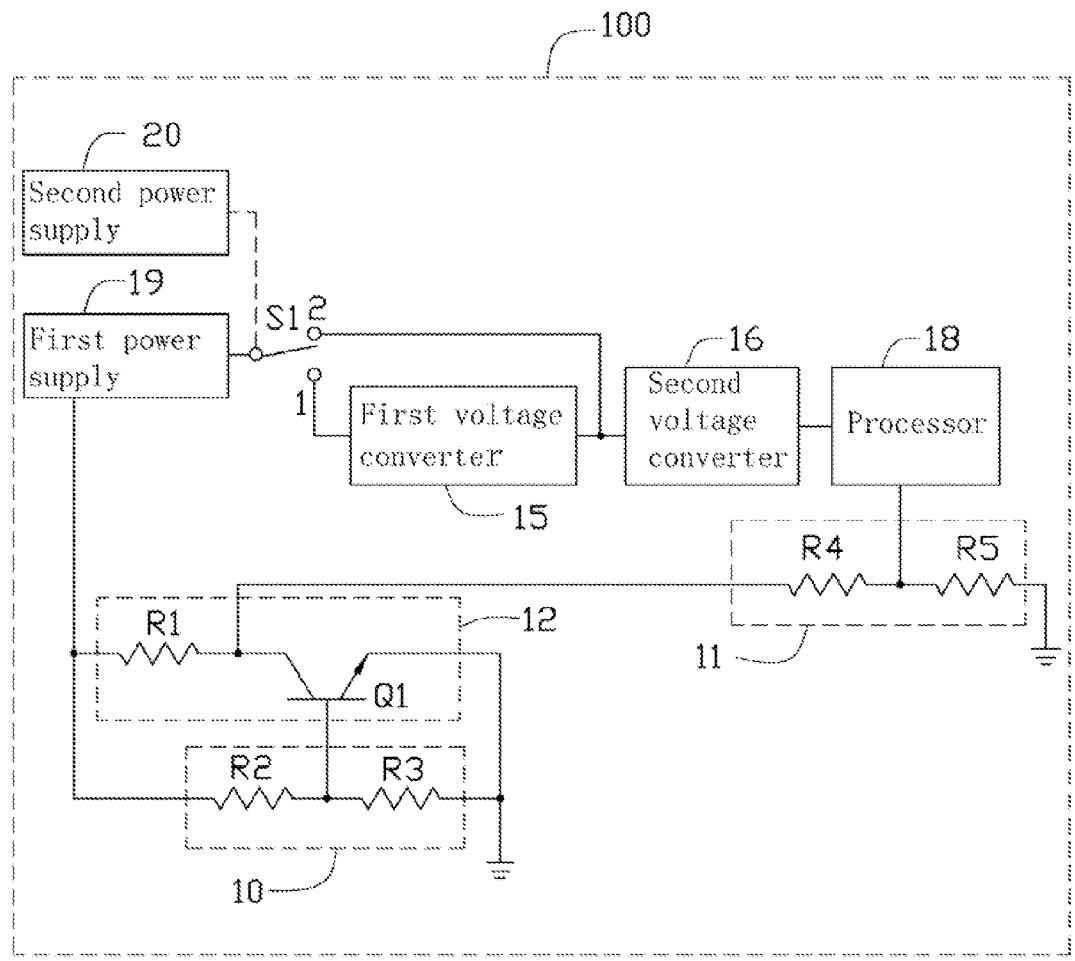
FIG. 2 is a circuit diagram of the reset circuit of FIG. 1.

Referring to FIG. 2, the switching circuit 12 includes a resistor R1 and a transistor Q1. The first voltage dividing circuit 10 includes a resistor R2 and a resistor R3. The second voltage dividing circuit 11 includes a resistor R4 and a resistor R5.

The first power supply 19 is configured to be connected to the collector of the transistor Q1 through the resistor R1. The first power supply 19 is connected to a terminal of the resistor R2. A terminal of the resistor R3 is connected to the other terminal of resistor R2 and the other terminal of resistor R3 is grounded. The base of the transistor Q1 is connected to a node between the resistors R2 and R3. The emitter of the transistor Q1 is grounded. The collector of the transistor Q1 is connected to a terminal of the resistor R4. A terminal of the resistor R5 is connected to the other terminal of the resistor R4 and the other terminal of the resistor R5 is grounded. The processor 18 is connected to a node between the resistors R4 and R5. In this embodiment, the resistors R2 and R3 are for providing voltage to the transistor Q1. Moreover, the resistances of the resistors R2, R3, and turn-on voltage Vq of the transistor Q1 meet a function as followed:

$$\frac{V1R3}{R2+R3} > Vq \text{ and } \frac{V2R3}{R2+R3} < Vq,$$

wherein R2 stands for the resistance of the resistor R2, R3 stands for the resistance of the resistor R3, V1 stands for the voltage of the first power supply 19 (namely +12V), and V2 stands for the voltage of the second power supply 20 (namely +5V).

In use, when the electronic device 100 is on, the pole is connected to the first contact 1 of the selection button S1. The first voltage converter 15 converts the first voltage from the first power supply 19 to the +5V. The second voltage converter 16 converts the +5V to the +1.5V, and supplies the +1.5V voltage to the processor 18.

According to the function $$\frac{V1R3}{R2+R3} > Vq,$$

the voltage at the node between the resistors R2 and R3 is greater than the turn-on voltage Vq of the transistor Q1. The first transistor Q1 is turned on. At this time, the collector of the transistor Q1 is at a low level. The node between the resistors R4 and R5 is at a low level. The processor 18 receives a low level signal. At this time, if the user connects the pole to the second contact 2 of the selection button S1, the second voltage converter 16 will convert the +5V from the second power supply 20 to the +1.5V for supplying power to the processor 18. Because the processor 18 receives a low level signal, the electronic device 100 is not restored to factory settings.

To restore the electronic device to factory settings, the user replaces the first power supply 19 with the second power supply 20, and connects the pole to the second contact 2 of the selection button S1. In other words, the first power supply 19 is disconnected from the switch S1, the first voltage dividing circuit 10, and the second voltage dividing circuit 11, and the second power supply 20 is connected to the pole of the switch S1. The first voltage dividing circuit 10, and the second voltage dividing circuit 11. The pole is further connected to the second contact 2 of the switch S1. At this time, the second voltage converter 16 converts the +5V voltage to the +1.5V voltage for supplying power to the processor 18. Furthermore, according to the function $$\frac{V2R3}{R2+R3} < Vq,$$

a voltage of the node between the resistors R2 and R3 is lower than the turn-on voltage Vq of the transistor Q1. The transistor Q1 is turned off. The collector of the transistor Q1 is at a high level. The processor 18 receives a high level signal. As a result, the electronic device 100 is restored to factory settings.

The foregoing description of the embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A reset circuit set in an electronic device for restoring the electronic device to factory settings, the reset circuit comprising:
   a single-pole-double-throw selection button, wherein a first terminal of a pole of the selection button is connected to a first power supply or a second power supply;
   a first voltage converter, wherein an input terminal of the first voltage converter is connected to a first contact of the selection button;
   a second voltage converter, wherein an input terminal of the second voltage converter is connected to a second contact of the selection button and an output of the first voltage converter;
   a processor connected to an output terminal of the second voltage converter;
   a first voltage dividing circuit;
   a second voltage dividing circuit connected to the first voltage dividing circuit and the processor; and
   a switching circuit connected between the first and second voltage dividing circuits;
   wherein when a second terminal of the pole is connected to the first contact of the selection button and the first terminal of the pole is connected to a first power supply, the first and second voltage converters convert a voltage from the first power supply to supply power for the processor, the first voltage dividing circuit turns on the switching circuit to make the second voltage dividing circuit output a first signal to the processor; when the second terminal of the pole is connected to the second contact of the selection button and the first terminal of the pole is connected to a second power supply, the second voltage converter converts a voltage from the second power supply to supply power for the processor, the first voltage dividing circuit turns off the switching circuit to make the second voltage dividing circuit output a second signal to the processor, and the processor restores the electronic device to factory default settings according to the second signal.

2. The reset circuit of claim 1, wherein the switching circuit comprises a first resistor and a transistor, the first voltage dividing circuit comprises a second resistor and a third resistor, the second voltage dividing circuit comprises a fourth resistor and a fifth resistor, the first power supply or second power supply is grounded through the second and third resistors in series, a collector of the transistor is connected to the first power supply or the second power supply through the first resistor, the collector of the transistor is further grounded through the fourth and fifth resistors in series, a base of the transistor is connected to a node between the second and third resistors, an emitter of the transistor is grounded, a node between the fourth and fifth resistors is connected to the processor.

* * * * *